(12) United States Patent
Cheng et al.

(10) Patent No.: US 10,236,382 B2
(45) Date of Patent: Mar. 19, 2019

(54) MULTIPLE FINFET FORMATION WITH EPITAXY SEPARATION

(71) Applicant: International Business Machines Corporation, Armonk, NY (US)

(72) Inventors: Kangguo Cheng, Schenectady, NY (US); Juntao Li, Cohoes, NY (US); Geng Wang, Stormville, NY (US); Qintao Zhang, Mt Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/723,277

(22) Filed: Oct. 3, 2017

(65) Prior Publication Data

US 2018/0096881 A1    Apr. 5, 2018

Related U.S. Application Data (62) Division of application No. 15/282,448, filed on Sep. 30, 2016, now Pat. No. 9,847,246.

(51) Int. Cl.
*H01L 29/78* (2006.01)
*H01L 21/762* (2006.01)
*H01L 21/768* (2006.01)

(52) U.S. Cl.
CPC ...... *H01L 29/785* (2013.01); *H01L 21/76224* (2013.01); *H01L 21/76879* (2013.01)

(58) Field of Classification Search
None
See application file for complete search history.

(56) References Cited

U.S. PATENT DOCUMENTS

| | | |
|---|---|---|
| 9,793,174 B1 | 10/2017 | Huang et al. |
| 2014/0154849 A1* | 6/2014 | Wang .......... H01L 21/743 438/243 |
| 2016/0322356 A1 | 11/2016 | Liu et al. |
| 2016/0336398 A1 | 11/2016 | Duriez et al. |

OTHER PUBLICATIONS

List of IBM Patents or Patent Applications Treated as Related; (Appendix P), Filed Oct. 4, 2017; 2 pages.
Kangguo Cheng et al., "Multiple FinFET Formation With Epitaxy Separation", U.S. Appl. No. 15/282,448, filed Sep. 30, 2016.

* cited by examiner

*Primary Examiner* — Whitney T Moore
(74) *Attorney, Agent, or Firm* — Cantor Colburn LLP; Vazken Alexanian (57) ABSTRACT

A semiconductor device includes a buried epitaxially grown substrate and a silicon on insulator (SOI) layer. The device also includes a buried oxide (BOX) layer between the buried epitaxially grown substrate and the SOI layer, an isolation trench having first width ($w_1$), a contact trench having a second width ($w_2$) and a capacitive trench having a third width ($w_3$). Methods are described that allow the formation of the trenches in a normal process flow.

20 Claims, 8 Drawing Sheets

MULTIPLE FINFET FORMATION WITH EPITAXY SEPARATION

DOMESTIC PRIORITY

This application is a Divisional of Non-Provisional application Ser. No. 15/282,448, entitled "MULTIPLE FINFET FORMATION WITH EPITAXY SEPARATION", filed Sep. 30, 2016 which is incorporated herein by reference in its entirety.

BACKGROUND

The present invention relates in general to semiconductor device fabrication methods and resulting structures. In particular, a method of forming a device and a device that can allow for measurement of device capacitance are described.

Silicon-on-insulator (SOI) devices offer several advantages over more conventional semiconductor devices. For example, SOI devices can have lower power consumption requirements than other types of devices that perform similar tasks. SOI devices can also have lower parasitic capacitances than non-SOI devices. This translates into faster switching times for the resulting circuits. In addition, the phenomenon of latch up, which is often exhibited by bulk complementary metal-oxide semiconductor (CMOS) devices, can be avoided when circuit devices are manufactured using SOI fabrication processes. SOI devices are also less susceptible to the adverse effects of ionizing radiation and, therefore, tend to be more reliable in applications where ionizing radiation can cause operation errors.

SUMMARY

According to one or more embodiments of the present invention, a method for forming an isolated region in a semiconductor is described. The method includes: receiving a base block including a buried epitaxially grown substrate disposed below a silicon on insulator (SOT) layer and a buried oxide (BOX) layer and a hardmask disposed over the BOX layer; patterning the hardmask layer to include at least first hole having first width ($w_1$), a second hole having a second width ($w_2$) and a third hole having a third width ($w_3$); forming an isolation trench below the first hole, a contact trench below the second hole and a capacitive trench below the third hole, the isolation trench, contact trench and the capacitive trench being formed by a reactive ion etching (RIE) process; depositing, in order, a dielectric layer, a metal layer, and a first polysilicon layer on walls of the isolation trench, the contact trench and the capacitive trench, wherein after the polysilicon layer is deposited, the capacitive layer is filled and the isolation trench and contact trench are not; removing the dielectric layer, the metal layer, and the polysilicon layer from the isolation trench and the contact trench; depositing a second polysilicon layer on walls of the isolation trench and the contact trench such that the contact trench is filled and the isolation trench is not completely filled; removing the polysilicon from the isolation trench; and filling the isolation trench with a dielectric material.

According to one or more embodiments of the present invention, a method of estimating a sheet resistance of a region of a base block including a buried epitaxially grown substrate disposed below a silicon on insulator (SOT) layer and a buried oxide (BOX) layer and a hardmask disposed over the BOX layer is described. The method includes: patterning the hardmask layer to include at least first hole having first width (w1), a second hole having a second width (w2) and a third hole having a third width (w3); forming an isolation trench below the first hole, a contact trench below the second hole and a capacitive trench below the third hole, the isolation trench, contact trench and the capacitive trench being formed by a reactive ion etching (RIE) process; depositing, in order, a dielectric layer, a metal layer, and a first polysilicon layer on walls of the isolation trench, the contact trench and the capacitive trench, wherein after the polysilicon layer is deposited, the capacitive layer is filled and the isolation trench and contact trench are not; removing the dielectric layer, the metal layer, and the polysilicon layer from the isolation trench and the contact trench; depositing a second polysilicon layer on walls of the isolation trench and the contact trench such that the contact trench is filled and the isolation trench is not completely filled; removing the polysilicon from the isolation trench; filling the isolation trench with a dielectric material; forming a contact on top of the contact trench; and measuring a sheet rho (e.g., resistance) via the contact.

According to one or more embodiments of the present invention a semiconductor device is described. The device includes a buried epitaxially grown substrate, a silicon on insulator (SOI) layer, and a buried oxide (BOX) layer between the buried epitaxially grown substrate and the SOI layer. The device also includes an isolation trench having first width (w1), a contact trench having a second width (w2); and a capacitive trench having a third width (w3). The isolation trench, the contact trench and the capacitive trench are formed by a method including: patterning a hardmask layer disposed over the SOI layer to include at least first hole having width w1, a second hole having width w2 and a third hole having width w3; forming the isolation trench below the first hole, the contact trench below the second hole and the capacitive trench below the third hole, the isolation trench, contact trench and the capacitive trench being formed by a reactive ion etching (RIE) process; depositing, in order, a dielectric layer, a metal layer, and a first polysilicon layer on walls of the isolation trench, the contact trench and the capacitive trench, wherein after the polysilicon layer is deposited, the capacitive layer is filled and the isolation trench and contact trench are not; removing the dielectric layer, the metal layer, and the polysilicon layer from the isolation trench and the contact trench; depositing a second polysilicon layer on walls of the isolation trench and the contact trench such that the contact trench is filled and the isolation trench is not completely filled; removing the polysilicon from the isolation trench; and filling the isolation trench with a dielectric material.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The terms "direct contact" or "directly contacting" mean that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, An SOI substrate includes a bottom substrate underneath a buried oxide (BOX) layer, with a top layer of a semiconductor material located over the BOX. As indicated above, the presence of the BOX in an SOI device can produce a relatively fast FET device by reducing the capacitance between the source/drain regions of the FET devices on the top semiconductor layer and the bottom substrate. The channel regions of the FET devices, which are located between the source/drain regions, can be decoupled from the bottom substrate by the BOX, allowing movement of the channel region potential with respect to the bottom substrate.

A difficulty encountered with SOI devices can come in at least two forms. Firstly, variation in the substrate formation (typically epitaxially grown) can lead to changes in sheet resistance of the raw SOI device (e.g., the SOI structure before it is processed to form a circuit or circuit element). Such variation can be hard to test and can require, in certain instances, damaging the SOI device. Secondly, to the extent that a capacitive element needs to be formed, that element will require additional processing.

The fabrication of capacitive element in an SOI structure during an isolation trench process can allow for early measurement of sheet resistance (p) of an SOI base component. This can be accomplished, for example, by providing for an SOI substrate contract process integrated with a deep trench process. The contact can also be used to form capacitors or means for measuring capacitance of the SOI base component.

Figure 1:
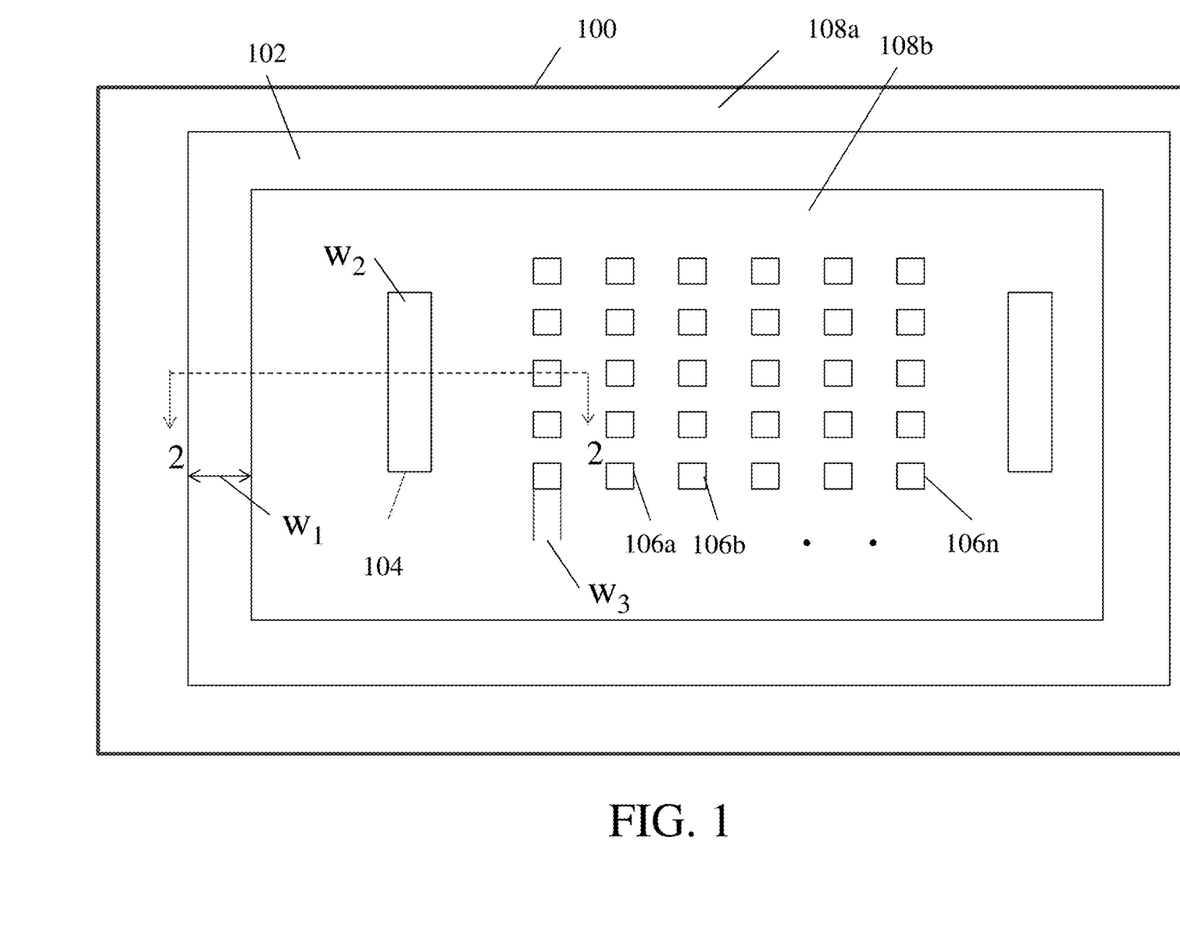
FIG. 1 depicts a top view of structure from that includes a plurality of holes that will form trenches formed therein.

FIG. 1 shows a top view of an SOI wafer 100 that has had a plurality of trenches 102, 104, 106 formed therein. FIG. 1 is discussed in combination with FIG. 2 which is a cross section of FIG. 1 taken along line 2-2.

Figure 2:
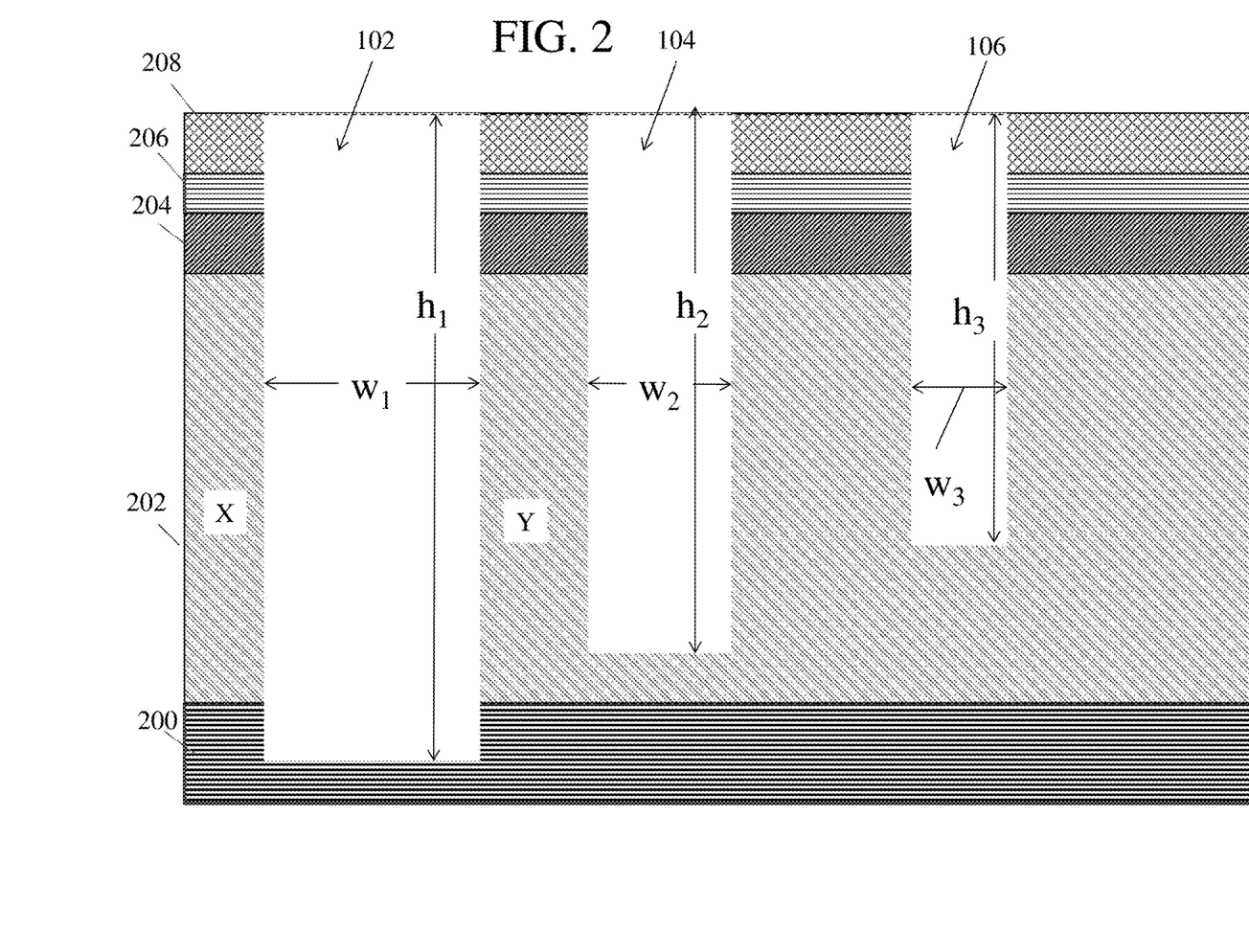
FIG. 2 is cross-section of the structure of FIG. 1 taken along line 2-2 and illustrates the starting structures that will form an isolation trench, a contact trench and a capacitive trench.

The trench labelled as trench 102 can be referred to as an isolation trench. Such a trench extends typically through an epitaxially grown substrate 202 to a base substrate layer 200. In this manner, the elements outside of the isolation trench 102 can be isolated from those inside it. That is, location "X" can be isolated from location "Y". That is, isolation trench 102 does not allow for travel of electrons from Y to X through the substrate 202. In FIG. 1 this is shown by separation of a first top section 108a from a second top section 108b by isolation trench 102.

In one embodiment, the base substrate 200 can be a P-doped substrate and the substrate 202 can be an N+ epitaxy layer. A buried oxide layer 204 is directly on top of the substrate 202 and separates it from a silicon-on-insulator (SOI) layer 206. In the discussion herein, it is assumed that a top hardmask layer 208 is used in etching processes and can be shaped such that it includes openings so that etching can occur below those openings.

It has been discovered that the width of the opening in the hardmask 208 is related to the depth of the trench formed below in. Thus, for a wider opening (e.g., W1) a deeper trench will be formed during a reactive ion etching (RIE) process. To that end, in one embodiment, the process of forming the trenches includes patterning the top of the hardmask 208 to allow for three different trench depths. The widest trench is the isolation trench 102 having width w1. The second trench, identified by reference numeral 104, is referred to as a contact trench 104 and extends into the substrate 202 without reaching the base substrate layer 200. This layer allows for contact with the substrate 202 as will become clearer from the discussion below and has a width w2.

Finally, one or more capacitance trenches 106a-106n can be formed that each has a width w3. In one embodiment, w1>w2>w3. Each trench has a height that is related to its width. Stated differently, an aspect ratio between an opening width in the hardmask 208 and the depth (shown as h1, h2, h3 where h1>h2>h3). Thus, the depth each trench can be selected by choosing an appropriate width w. In one embodiment, W1=250 nm, W2=170 nm, W3=90 nm The isolation trench 102 is a typically formed trench. Herein, the contact and capacitance trenches 104, 106 can be formed in the same process flow. All of the trenches 102, 104, 106 can be formed by an RIE process.

Figure 3:
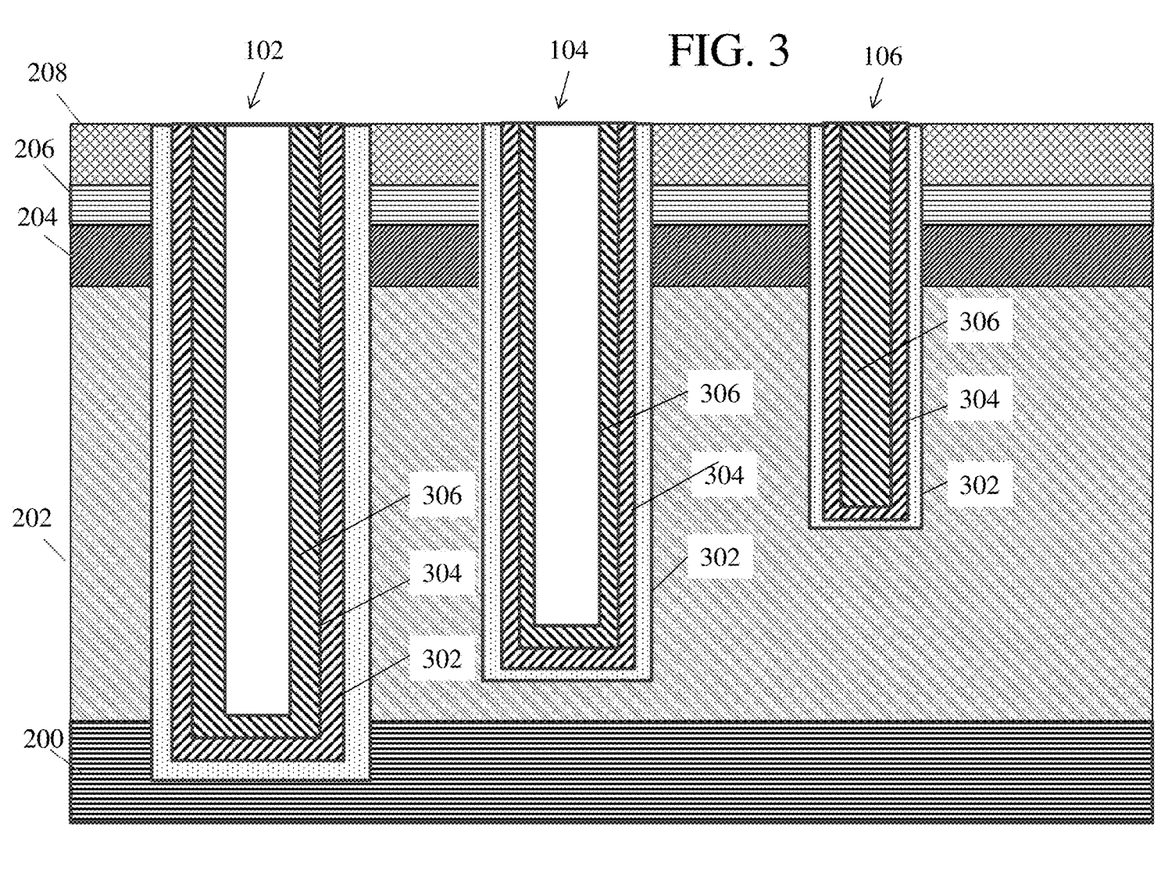
FIG. 3 shows the structure of FIG. 2 after the trenches have been filled with the dielectric, metal and polysilicon layers formed progressively inward from outer sides of the trenches.

As shown in FIG. 3, each trench has three layers deposited on it. In particular, each trench has a dielectric layer 302 deposited on its inner walls. Then, a metal layer 304 is deposited. The layer 302 has a thickness that is the same as that of layer 304. Layer 306 is deposited with such a thickness that only capacitance trench 106 is fully filled while the contact trench 104 and the isolation trenches are not fully filled.

The metal layer 304 can be titanium nitride (TiN) in one embodiment. Then an N+ polysilicon layer 306 is deposited. In one embodiment, the thickness of the layers 302-306 are selected such that deposition of the polysilicon layer 306 will result in the capacitance trench 106 being fully filled. This allows for that trench to withstand further etching steps below without all of the layers 302-306 being removed as the ability for an etchant to contact those layer is limited to only the "top" of these layers.

Figure 4:
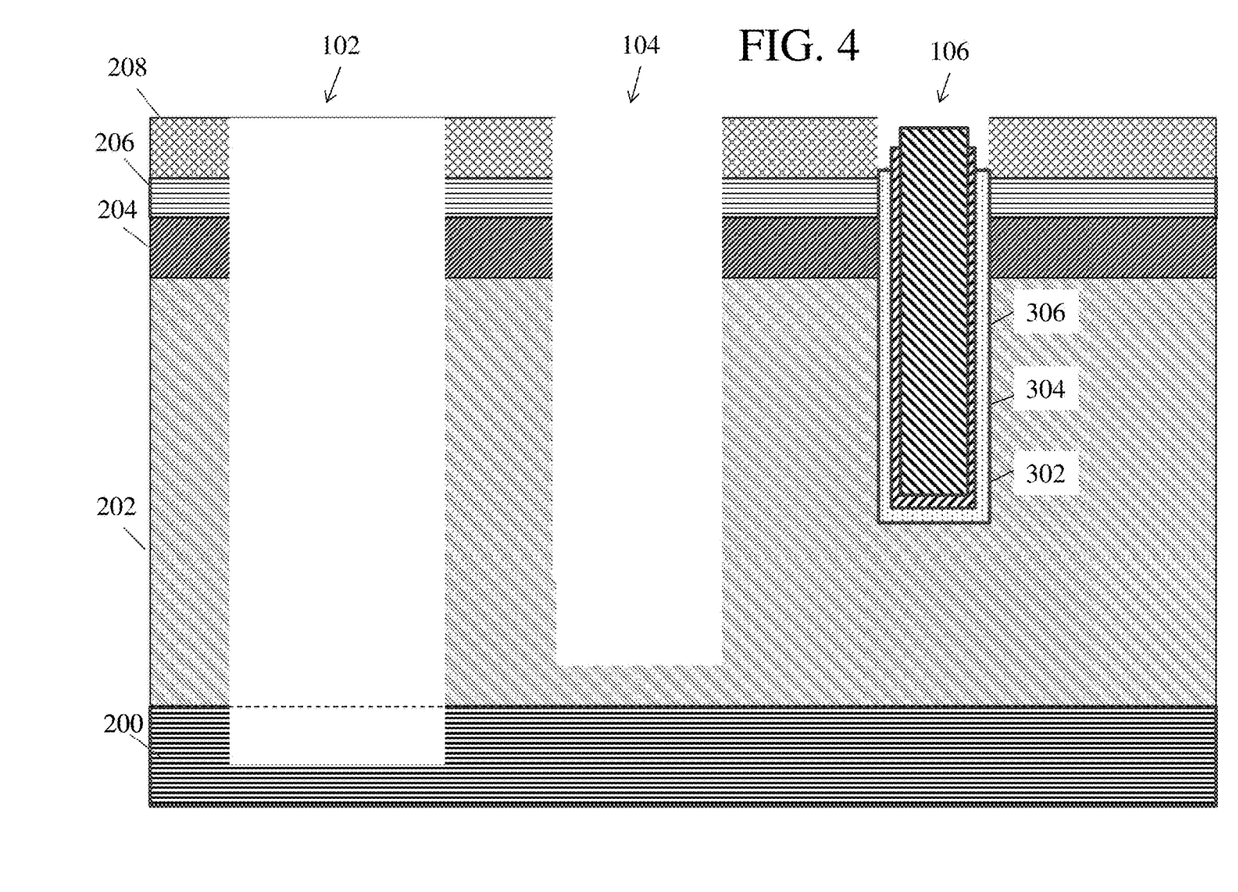
FIG. 4 shows the structure of FIG. 3 after the dielectric, metal and polysilicon layers have been completely removed from the isolation and contact trenches and partially from the capacitive trench.

The structure shown in FIG. 3 is then subjected to a wet etch. The polysilicon 306, metal 304 and dielectric 302 are completely removed from the isolation trench 102 and the contact trench 104 as shown in FIG. 4.

Figure 5:
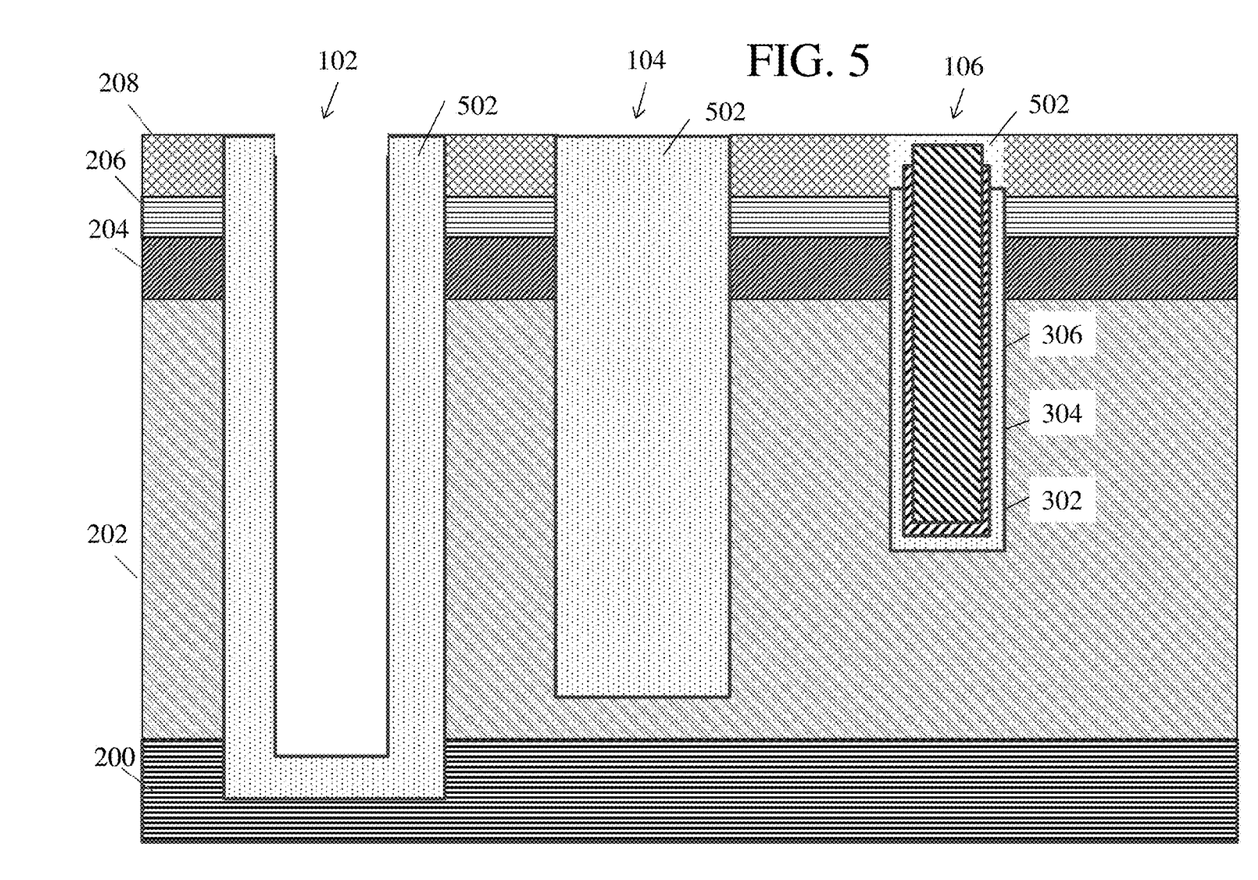
FIG. 5 shows the structure of FIG. 4 after a polysilicon has been deposited on walls of the isolation and contact trenches and partially into the capacitive trench.

Then another polysilicon layer 502 is deposited in all of the trenches 102-106. The width of this layer can be selected such that is greater than ½w2 so that the contact trench 104 is fully filled with polysilicon layer 502. Layers 502 and 306 are formed of the same material in one embodiment but this is optional. In one embodiment, the polysilicon layer 502 is formed of an N+ polysilicon material.

Figure 6:
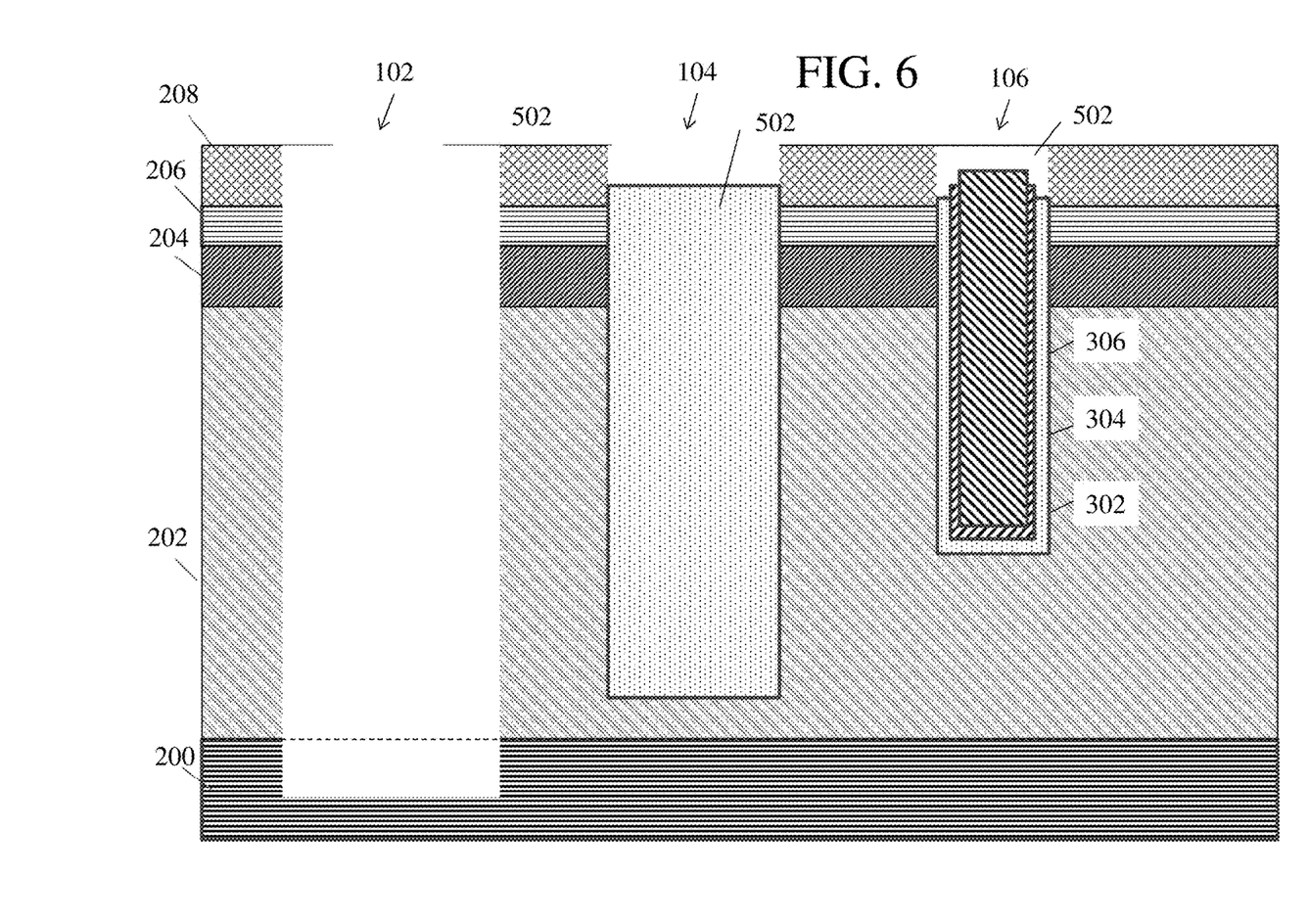
FIG. 6 shows the structure of FIG. 5 after the polysilicon has been removed from the isolation trench.

The polysilicon layer 502 is then completely removed from the isolation trench 102 as shown in FIG. 6. This can be accomplished by a wet etch in one embodiment. As above, the surface of the polysilicon layer in the contact trench 104 and the capacitance trench 106 will contact less of the wet etchant as the surface area exposed to the etchant is less than in the isolation trench 106.

Figure 7:
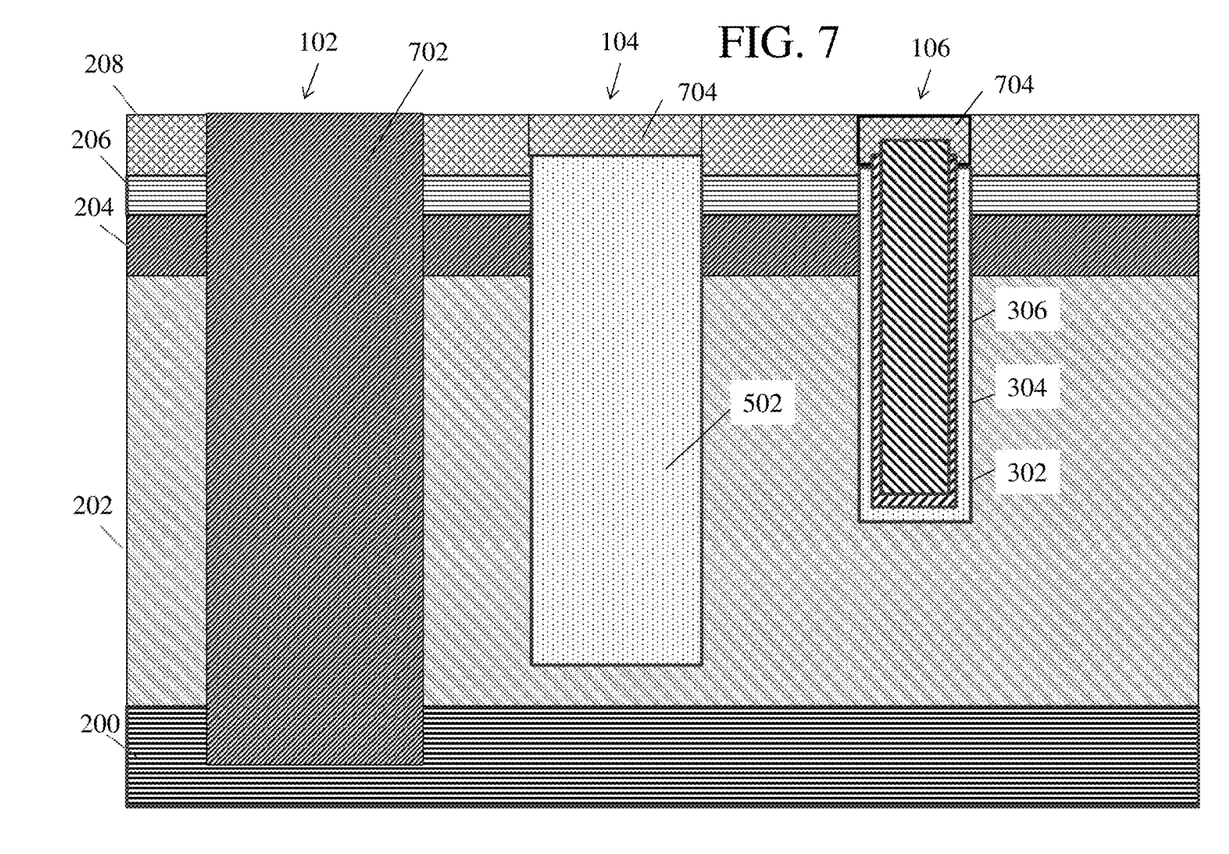
FIG. 7 shows the structure of FIG. 6 after the isolation trench has been filled with a dielectric material.

As shown in FIG. 7, the isolation trench 104 can be filled with a dielectric 702. During this step, hardmask covers (shown as blocks 704) can be formed over the contact and capacitive trenches 104, 106. These covers can then be removed by planarization.

Figure 8:
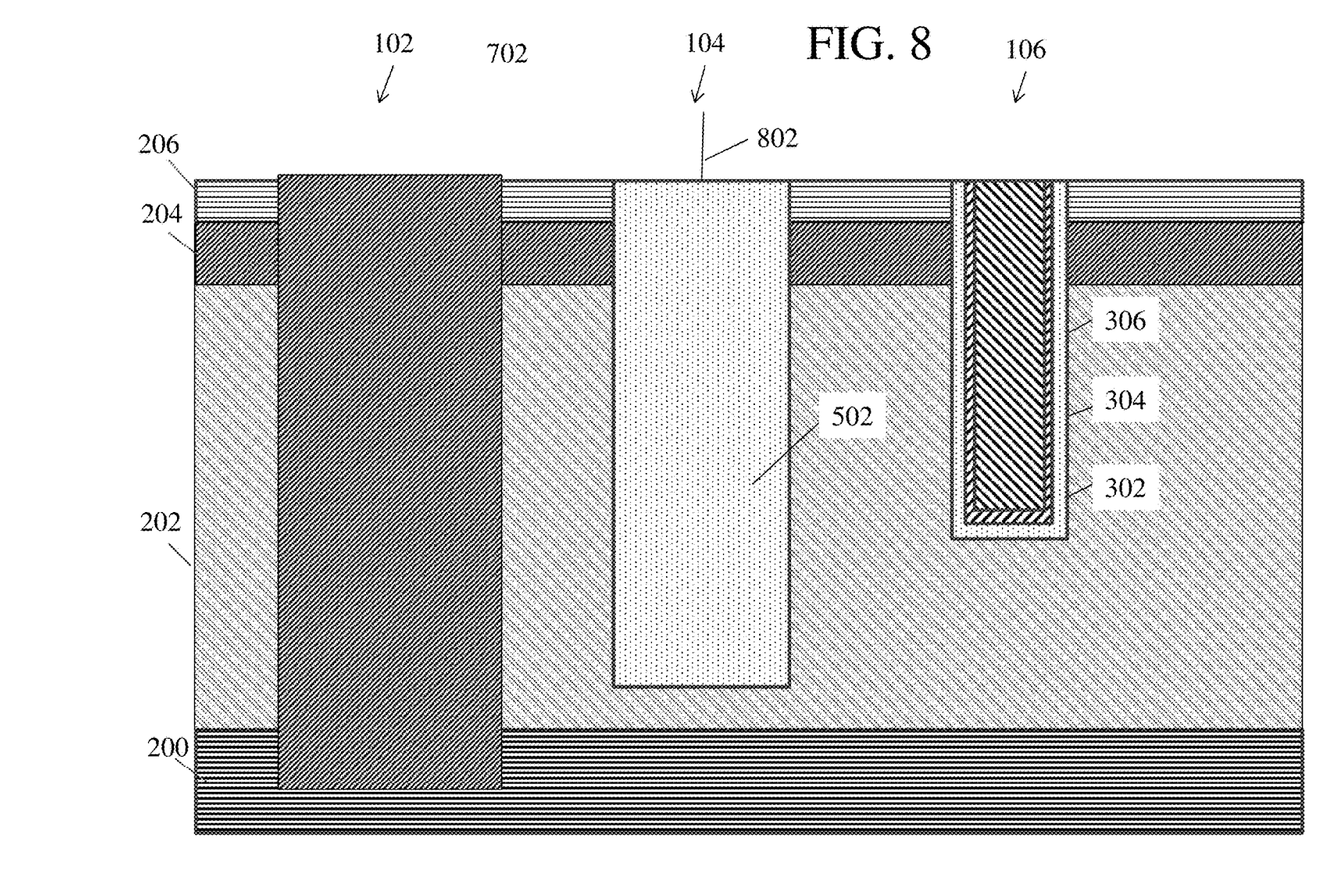
FIG. 8 shows the structure of FIG. 7 after metal contacts have been added to the contact and capacitive trenches.

Planarization removes the top layer and exposes SOI 206 for further processing. Sheet rho in the enclosed area (e.g., within area surrounded isolation trench 102 as shown in FIG. 1) can be measured with direct probing on trench capacitive trench 104 to infer capacitance in contact trench 106. Such measurement can be conducted by contact 802.

Based on the descriptions herein, a method of measuring a sheet rho for a wafer is or a region thereof is provided. The trenches formed above allow for the indirect measurement of the capacitance of the trenches to feedback to the upstream processes such as deep trench etch. Because the etch process carves out silicon from the substrate, when measuring the sheet rho in the areas with large density of storage capacitors, it will exhibit higher resistance. This resistance is highly correlated with capacitance which is difficult to measure before all the contacts are made. The conductor filled in contact trench 104 and the relative large size of 104 allows for direct probing and measurement of sheet rho, which can then be used to infer the capacitance.

It shall be further understood that after the trenches are formed, before or after rho is measured additional elements can be added to for a VLSI. Such elements include, for example, transistors and capacitors to name but few.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method of estimating a sheet resistance of a region of a base block including a buried epitaxially grown substrate disposed below a silicon on insulator (SOI) layer and a buried oxide (BOX) layer and a hardmask disposed over the BOX layer, the method comprising:
   patterning the hardmask layer to include at least first hole having first width ($w_1$), a second hole having a second width ($w_2$) and a third hole having a third width ($w_3$);
   forming an isolation trench below the first hole, a contact trench below the second hole and a capacitive trench below the third hole, the isolation trench, contact trench and the capacitive trench being formed by a reactive ion etching (RIE) process;
   depositing, in order, a dielectric layer, a metal layer, and a first polysilicon layer on walls of the isolation trench, the contact trench and the capacitive trench, wherein, after the polysilicon layer is deposited, the capacitive trench is filled and the isolation trench and contact trench are not;
   removing the dielectric layer, the metal layer, and the polysilicon layer from the isolation trench and the contact trench;
   depositing a second polysilicon layer on walls of the isolation trench and the contact trench such that the contact trench is filled and the isolation trench is not completely filled;
   removing the polysilicon from the isolation trench;
   filling the isolation trench with a dielectric material;
   forming a contact on top of the contact trench; and
   determining a sheet rho via a measurement made on the contact.

2. The method of claim 1, wherein $w_1$ is greater than $w_2$.

3. The method of claim 1, wherein $w_2$ is greater than $w_3$.

4. The method of claim 1, wherein heights of the isolation trench, the contact trench and the capacitive trench are proportional to the widths of the first, second and third holes, respectively.

5. The method of claim 1, wherein the isolation trench extends through the epitaxially grown layer.

6. The method of claim 1, wherein the buried epitaxially grown substrate is an N+ layer.

7. The method of claim 1, wherein the second polysilicon layer is an N+ polysilicon layer.

8. The method of claim 1, wherein the method further includes forming additional circuit elements over the SOI.

9. The method of claim 1, wherein the contact is formed of metal.

10. The method of claim 1, wherein the measurement is measurement of capacitance at the contact.

11. The method of claim 10, wherein the sheet rho is determined based on the measured capacitance.

12. A semiconductor device from which a sheet capacitance can be measured, the device comprising:
    a buried epitaxially grown substrate;
    a silicon on insulator (SOI) layer;
    a buried oxide (BOX) layer between the buried epitaxially grown substrate and the SOI layer;
    an isolation trench having first width ($w_1$);
    a contact trench having a second width ($w_2$); and
    a capacitive trench having a third width ($w_3$);
    wherein isolation trench, the contact trench and the capacitive trench are formed by a method including:
    patterning a hardmask layer disposed over the SOI layer to include at least first hole having width $w_1$, a second hole having width $w_2$ and a third hole having width $w_3$;
    forming the isolation trench below the first hole, the contact trench below the second hole and the capacitive trench below the third hole, the isolation trench, contact trench and the capacitive trench being formed by a reactive ion etching (RIE) process;
    depositing, in order, a dielectric layer, a metal layer, and a first polysilicon layer on walls of the isolation trench, the contact trench and the capacitive trench, wherein, after the polysilicon layer is deposited, the capacitive trench is filled and the isolation trench and contact trench are not;
    removing the dielectric layer, the metal layer, and the polysilicon layer from the isolation trench and the contact trench;
    depositing a second polysilicon layer on walls of the isolation trench and the contact trench such that the contact trench is filled and the isolation trench is not completely filled;
    removing the polysilicon from the isolation trench; and
    filling the isolation trench with a dielectric material.

13. The device of claim 12, wherein $w_1$ is greater than $w_2$.

14. The device of claim 13, wherein $w_2$ is greater than $w_3$.

15. The device of claim 12, wherein heights of the isolation, contact and capacitive trenches are proportional to the widths of the first, second and third holes, respectively.

16. The device of claim 12, wherein the isolation trench extends through the epitaxially grown layer.

17. The device of claim 12, wherein the buried epitaxially grown substrate is an N+ layer.

18. The device of claim 12, wherein the second polysilicon layer is an N+ polysilicon layer.

19. The device of claim 12, wherein the method further includes forming additional circuit elements over the SOI.

20. The device of claim 12, wherein the method further includes forming a contact on top of the contact trench.

* * * * *